United States Patent [19]
Shimada et al.

[11] 4,101,921
[45] Jul. 18, 1978

[54] MEMORY TYPE INSULATING GATE FIELD EFFECT SEMICONDUCTOR DEVICE

[75] Inventors: Takashi Shimada, Yamato; Kenichi Inoue, Kawasaki; Takaji Ohtsu, Hatano; Hidenobu Mochizuki, Atsugi; Jiro Yamaguchi, Yokohama, all of Japan

[73] Assignee: Sony Corporation, Tokyo, Japan

[21] Appl. No.: 772,099

[22] Filed: Feb. 25, 1977

[30] Foreign Application Priority Data

Mar. 1, 1976 [JP] Japan .................................. 51-21998

[51] Int. Cl.$^2$ ............................................. H01L 29/78
[52] U.S. Cl. ........................................ 357/23; 357/54; 357/55
[58] Field of Search ............................... 357/23, 54, 55

[56] References Cited

U.S. PATENT DOCUMENTS 3,877,055  4/1975  Fisher et al. ........................... 357/23
4,011,576  3/1977  Uchida et al. .......................... 357/23

Primary Examiner—Edward J. Wojciechowicz

Attorney, Agent, or Firm—Hill, Gross, Simpson, Van Santen, Steadman, Chiara & Simpson

[57] ABSTRACT

In a memory type insulated gate field effect semiconductor device including a semiconductor layer of one conductivity type, a source region of the opposite conductivity type formed in the surface of the semiconductor layer, a drain region of the opposite conductivity type formed in the surface of the semiconductor layer, a gate insulating layer affixed to the surface of the semiconductor layer, and a gate electrode deposited on the surface of the gate insulating layer, the gate insulating layer has a pair of thick gate guarding portions which exist on side of the source and drain regions, and a thin memory portion intermediate between the thick gate guarding portions, and a surface impurity concentration per square centimeter of the semiconductor layer under the thick gate guarding portions is different from a surface impurity concentration per square centimeter of the semiconductor layer under the tin memory portion. The voltage difference between the threshold voltages of the semiconductor device at the memorized state and at the non-memorized state can be increased, and the read-out voltage of the semiconductor device can be reduced. The circuit design is simplified.

9 Claims, 18 Drawing Figures

PRIOR ART

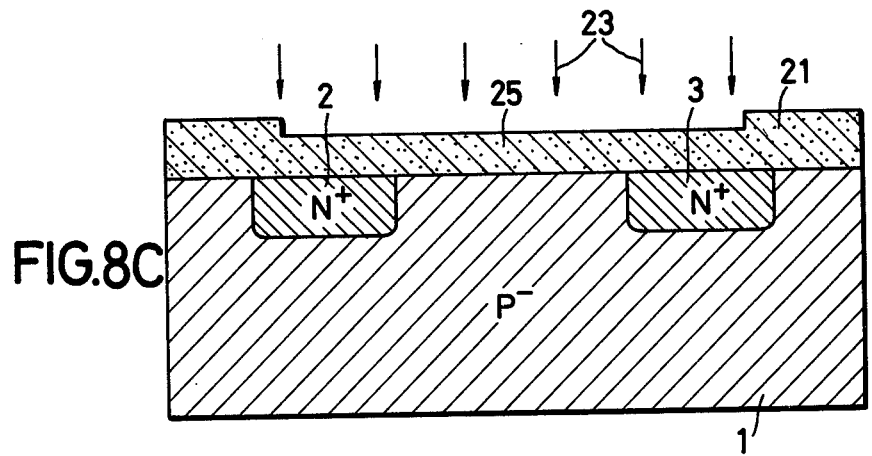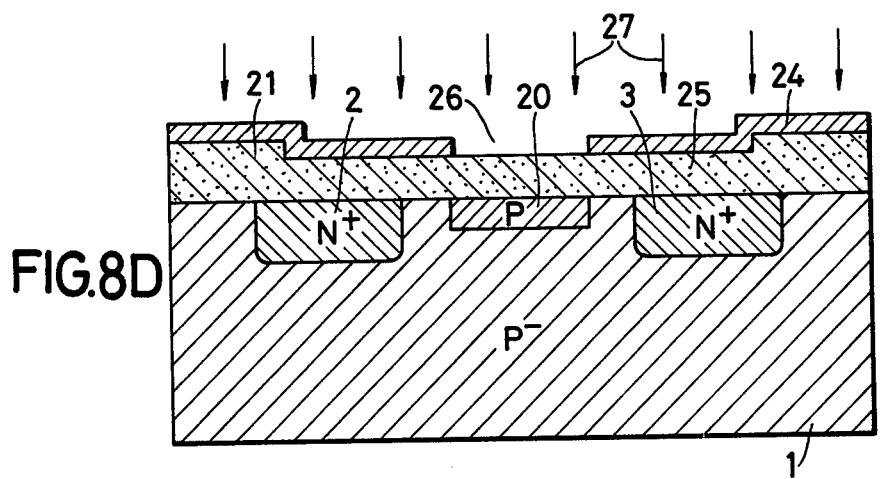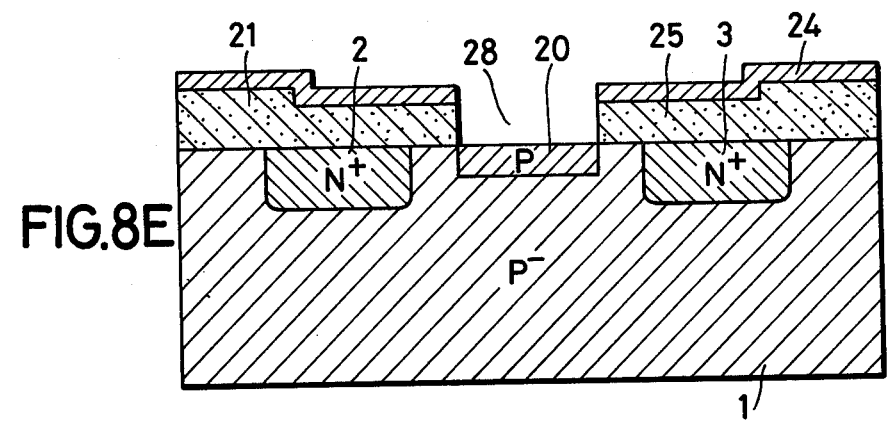

4,101,921

MEMORY TYPE INSULATING GATE FIELD EFFECT SEMICONDUCTOR DEVICE

BACKGROUND OF THE INVENTION

1. Field of the Invention

This invention relates to a memory type insulated gate field effect semiconductor device, and more particularly to a memory type insulated gate field effect semiconductor device which includes a semiconductor layer of one conductivity type, a source region of the opposite conductivity type formed in the surface of the semiconductor layer, a drain region of the opposite conductivity type formed in the surface of the semiconductor layer, a gate insulating layer affixed to the surface of the semiconductor layer, and a gate electrode deposited on the surface of the gate insulating layer, and in which the gate insulating layer has a pair of thick gate guarding portions existing on side of the source and drain regions, and a thin memory portion intermediate between the thick gate guarding portions.

2. Description of the Prior Art

In a conventional MNOS-type memory transistor, a gate insulating layer is so formed as to be thicker near source and drain regions than at a memory gate portion, in order to increase the brake-down voltages of the source and drain regions, and to guard the gate insulating layer against repeated writing pulses and erasing pulses. FIG. 1 shows the conventional MNOS-type memory transistor.

Referring to FIG. 1, N-type source and drain regions 2 and 3 are formed in the surface of a P-type semiconductor substrate 1. A SiO$_2$ layer 4 functioning as a gate insulating layer 5 is formed on the semiconductor substrate 1. The gate insulating layer 5 defines a pair of gate guarding portions 6 of thickness 400 to 1000Å adjacent to the source and drain regions 2 and 3, and a memory portion 7 of thickness 20 to 30 Å intermediate between the gate guarding portions 6. A Si$_3$N$_4$ layer 8 of thickness 500 to 700Å is formed on the SiO$_2$ layer 4 and 5. A source electrode 9, a drain electrode 10 and a gate electrode 11 are deposited on the Si$_3$N$_4$ layer.

In the memory transistor of FIG. 1, it is proved that the positive charge density of the thin memory portion 7 is higher than that of the thick gate guarding portions 6. Accordingly, in the enhancement type memory transistor, the threshold voltage $V_{TH}$ of the gate guarding portions 6 is higher than that of the memory portion 7, as shown in FIG. 2, When the semiconductor substrate 1 is of the N-type conductivity and a P-type channel is formed therein, the $V_{TH}$ of the gate guarding portion 6 is lower than that of the memory portion 7, in negative polarity, as shown in FIG. 3.

The N-type channel memory transistor of FIG. 1 is equivalent to three MNOS-type memory transistors constituted by the memory portion 7 and the pair of the gate guarding portions 6 connected in series with each other. Accordingly, at the level "0", namely at the non-memorized state, the $V_{TH}$ of the memory transistor of FIG. 1 is that of the thick gate guarding portions 6. When a positive voltage is applied to the gate electrode 11 to inject electrons from the semiconductor substrate 1 into the boundary surface between the Si$_3$N$_4$ layer 8 and the SiO$_2$ layer 7, the memory transistor of FIG. 1 is put at the level "1", namely at the memorized state. The $V_{TH}$ of the memory portion 7 is raised up at the level "1", as shown in FIG. 4. Accordingly, the $V_{TH}$ of the memory transistor of FIG. 1 becomes that of the thin memory portion 7. There is a voltage difference (window of memory) between the $V_{TH}$ of the gate guarding portion 6 at the level "0" and the $V_{TH}$ of the memory portion 7 at the level "1", in the memory transistor of FIG. 1.

Since it is preferable that the voltage difference between the $V_{TH}$ of the memory transistor at the level "0" and the $V_{TH}$ of the memory transistor at the level "1" is larger in consideration of attenuation of memory, a voltage difference between the $V_{TH}$ of the memory portion 7 at the level "0" and the $V_{TH}$ of the gate guarding portion 6 at the level "0" is undesirable. Accordingly, it is advantageous to make the $V_{TH}$ of the memory portion 7 approach to the $V_{TH}$ of the thick gate guarding portion 6 at the level "0".

In the P-type channel memory transistor, the $V_{TH}$ of the memory portion 7 at the level "0" is higher than that of the gate guarding portion 6 at the level "0", in negative polarity. Accordingly, there is no problem on the voltage difference between the $V_{TH}$ of the memory transistor at the level "0" and the $V_{TH}$ of the memory transistor at the level "1". However, since a read-out voltage needs to be about three times as high as the $V_{TH}$ of the memory transistor at the level "0", it is required that the read-out voltage is increased with the $V_{TH}$ of the memory transistor at the level "0", and that the voltage difference between the $V_{TH}$ of the memory transistor at the level "0" and the $V_{TH}$ of the memory transistor at the level "1" is increased with the read-out voltage. That affects the reliability of integrated circuits from the view point of memory attenuation. Accordingly, it is required to make the $V_{TH}$ of the memory portion 7 at the level "0" decrease or approach to the $V_{TH}$ of the gate guarding portion 6 at the level "1".

SUMMARY OF THE INVENTION

An object of this invention is to provide a memory type insulated gate field effect semiconductor device which overcomes the above described disadvantages of the conventional memory type insulated gate field effect semiconductor device.

Another object of this invention is to provide a memory type insulated gate field effect semiconductor device which is improved in the voltage difference and the read-out voltage.

A further object of this invention is to provide a memory type insulated gate field effect semiconductor device which facilitates circuit design.

A still further object of this invention is to provide a memory type insulated gate field effect semiconductor device which can be easily manufactured.

In accordance with one aspect of this invention, in a memory type insulated gate field effect semiconductor device including a semiconductor layer of one conductivity type, a source region of the opposite conductivity type formed in the surface of the semiconductor layer, a drain region of the opposite conductivity type formed in the surface of the semiconductor layer, a gate insulating layer affixed to the surface of the semiconductor layer, and a gate electrode deposited on the surface of the gate insulated layer, the gate insulating layer having a pair of thick gate guarding portions which exist on side of the source and drain regions, and a thin memory portion intermediate between the thick gate guarding portions, the improvement in which a surface impurity concentration per square centimeter of the semiconductor layer under the thick gate guarding portions is different from a surface impurity concentration per square centimeter of the semiconductor layer under the thin memory portion.

The above, and other objects, features and advantages of this invention, will be apparent in the following detailed description of an illustrative embodiment which is to be read in connection with the accompanying drawings.

BRIEF DESCRIPTION OF THE DRAWINGS

FIG. 8A to FIG. 8G are a series of cross-sectional views showing progressive stages of a method for manufacturing the memory transistor of FIG. 6;

DESCRIPTION OF THE PREFERRED EMBODIMENTS

Figure 1:
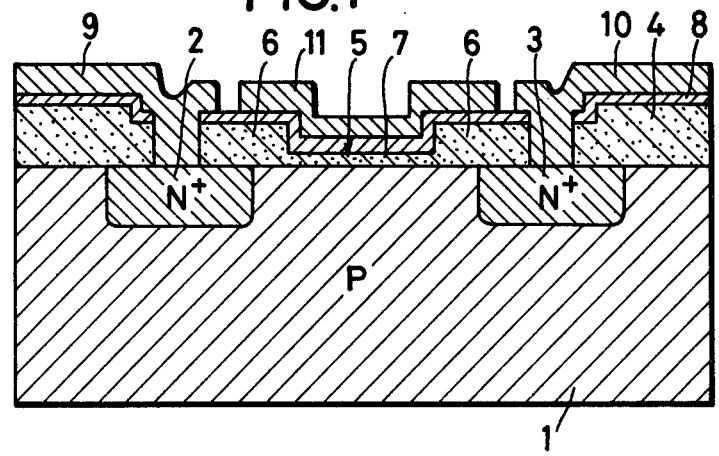
FIG. 1 is a cross-sectional view of a conventional MNOS-type N-channel memory transistor.
Figure 2:
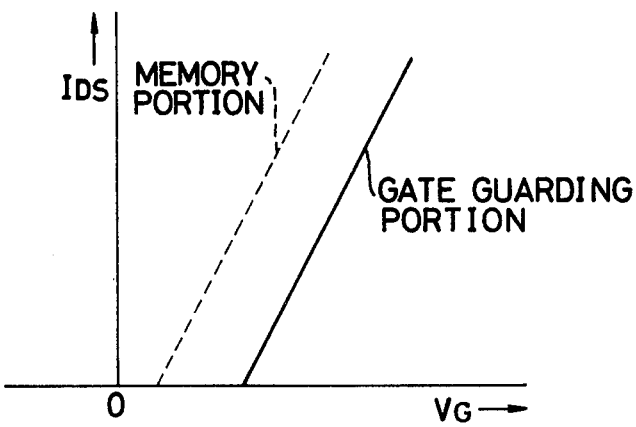
FIG. 2 is a graph showing the $I_{DS}$-$V_G$ characteristics of the memory transistor of FIG. 1 and the $V_{TH}$ thereof at the level "0"
Figure 3:
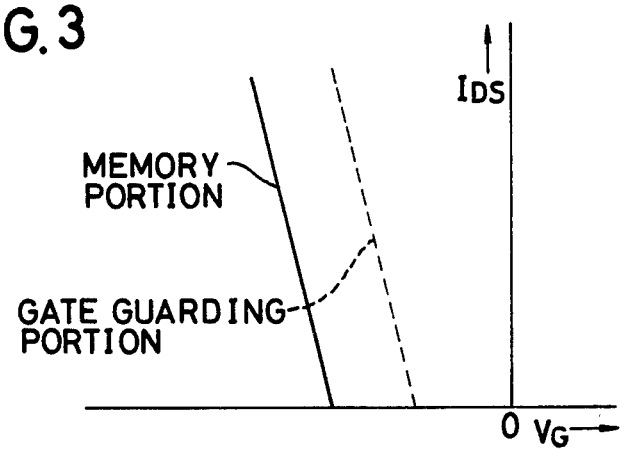
FIG. 3 is a graph showing the $I_{DS}$-$V_G$ characteristics of a conventional MNOS-type P-channel memory transistor and the $V_{TH}$ thereof at the level "0".

Embodiments of this invention which are applied to integrated MNOS-type memory transistor, will be described with reference to FIG. 6 to FIG. 12. Parts in the embodiments which correspond to the parts in the memory transistor of FIG. 1, are denoted by the same reference numerals, which will not be described in detail.

One embodiment of this invention will be described with reference to FIG. 6 to FIG. 10.

Figure 6:
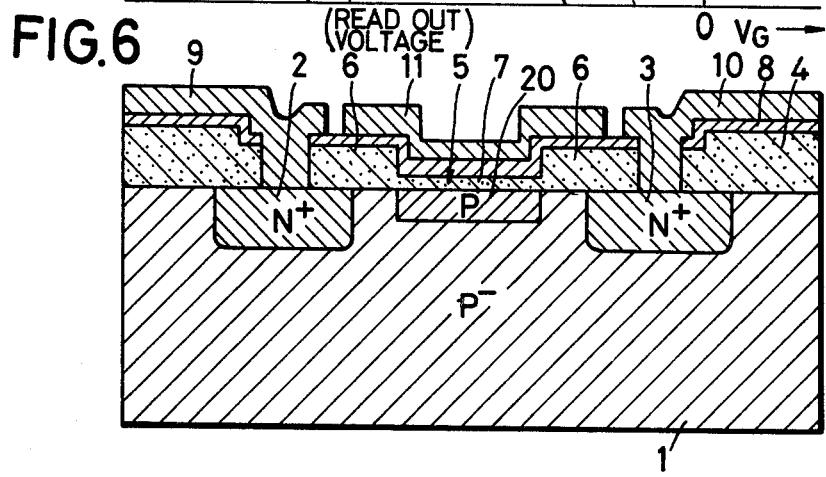
FIG. 6 is a cross-sectional view of an integrated MNOS-type N-channel memory transistor according to one embodiment of this invention.

A memory transistor according to this embodiment is shown in FIG. 6. Directly under a memory portion 7, a P-type semiconductive region 20 is formed to the depth of about 1µ in a semiconductor substrate 1, so as to have the same cross section as the memory portion 7. The P-type semiconductive region 20 is formed by an ion implantation method to be described hereafter. The surface impurity concentration of the P-type semiconductive region 20 per square centimeter is higher than that of the semiconductor substrate 1 directly under gate guarding portions 6. The surface impurity concentration of the P-type semiconductive region 20 is so selected as to make the $V_{TH}$ of the memory portion 7 approach closely to the $V_{TH}$ of the gate guarding portion 6 at the level "0". The surface impurity concentration of the P-type semiconductive region 20 is preferably $5 \times 10$ inches to $2 \times 10^{12}$/cm$^2$.

Figure 4:
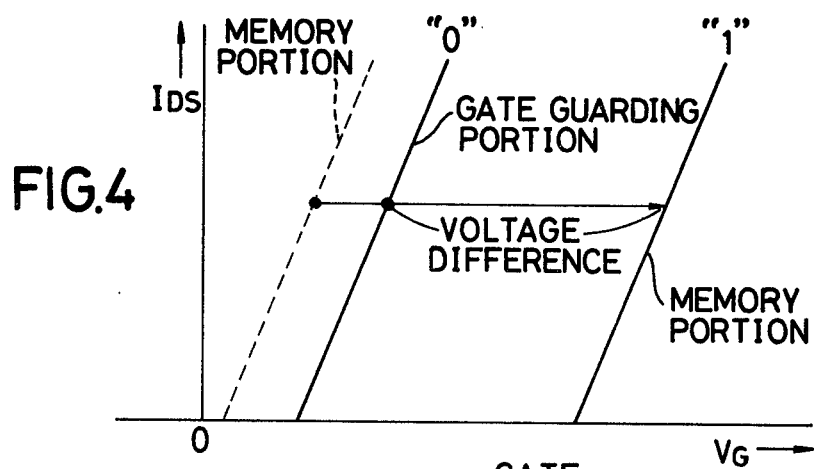
FIG. 4 is a graph showing the $I_{DS}$-$V_G$ characteristics of the memory transistor of FIG. 1 and the shift of the $V_{TH}$ of the memory transistor of FIG. 1 when the memory transistor of FIG. 1 is put at the level "1"
Figure 7:
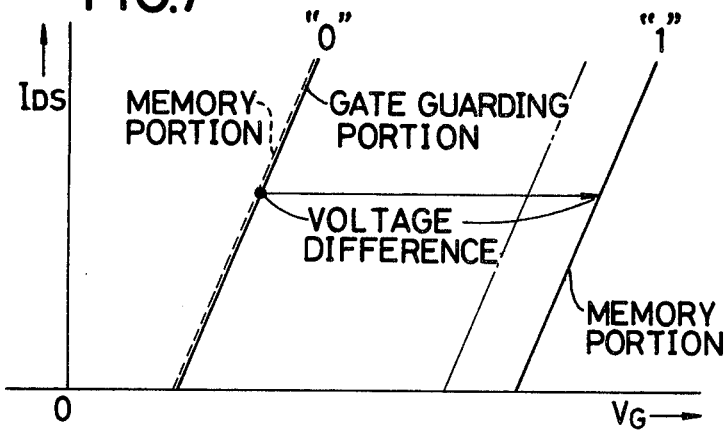
FIG. 7 is a graph showing the $I_{DS}$-$V_G$ characteristics of the memory transistor of FIG. 6 and the shift of the $V_{TH}$ of the memory transistor of FIG. 6, when the memory transistor is put at the level "1"

As shown in FIG. 7, the $V_{TH}$ of the memory portion 7 at the level "0" is raised nearly to the $V_{TH}$ of the gate guarding portion 6. The $V_{TH}$ of the memory portion 7 at the level "1" is shifted by the raised height in the positive direction. Accordingly, the voltage difference between the $V_{TH}$ of the gate guarding portion 6 at the level "0" and the $V_{TH}$ of the memory portion 7 at the level "1" is much larger than the voltage difference shown in FIG. 4. The voltage difference between the $V_{TH}$ of the memory transistor at the level "0" and the $V_{TH}$ of the memory transistor 7 at the level "1" is increased.

Next, a method for manufacturing the memory transistor according to this embodiment will be described with reference to FIG. 8A to FIG. 8G.

Figure 8A:
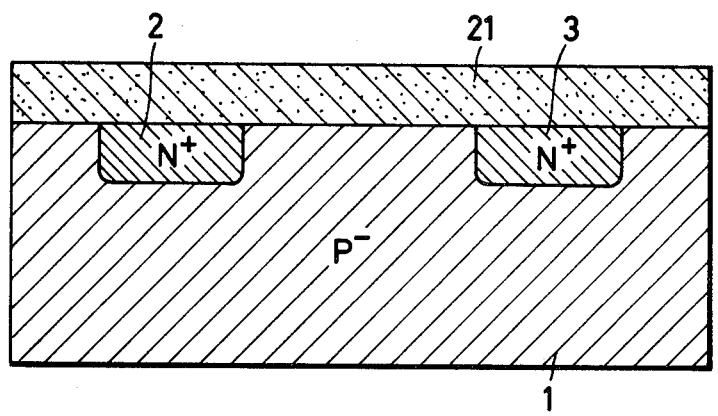
Figure 8B:
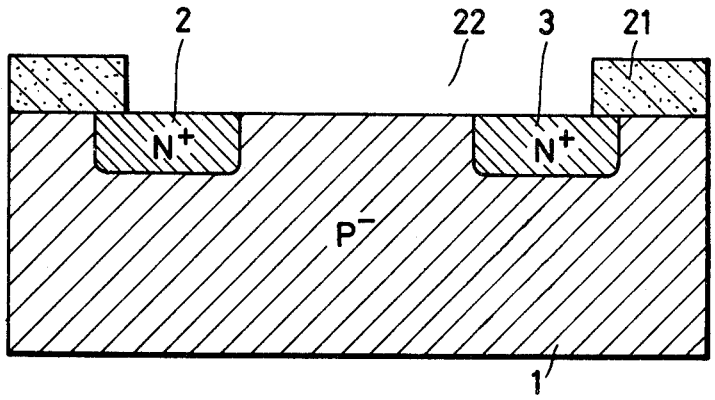

First, as shown in FIG. 8A, a SiO$_2$ layer 21 is deposited, to the depth of about 10000Å, onto the P-type semiconductor substrate 1 in which an N$^+$-type source region 2 and an N$^+$-type drain region 3 are formed by a diffusion method. Next, as shown in FIG. 8B, a predetermined portion of the SiO$_2$ layer 21 is etched to form an opening 22. Then, as shown in FIG. 8C, the exposed portion of the semiconductor substrate 1 at the opening 22 is thermally oxidized to form a SiO$_2$ layer 25 to become a gate insulating layer to the thickness of about 500 to 1000Å. As occasion demands, an ion beam 23 of P-type impurities such as boron is injected into the semiconductor substrate 1 between the source region 2 and the drain region 3, to increase the surface concentration of impurities and thereby to somewhat rise the $V_{TH}$ there. However, when the surface concentration of impurities of the semiconductor substrate 1 itself is so selected as to obtain the predetermined $V_{TH}$, the irradiation of the ion beam 23 is not always required.

Next, as shown in FIG. 8D, photo resist 24 is coated on the SiO$_2$ layers 21 and 25, and an opening 26 is formed in the layer of photo resist 24 by a conventional photo process, corresponding to the memory portion 7. An ion beam 27 of P-type impurities such as boron is injected to the semiconductor substrate 1 by using the photo resist layer 24 as a mask. The P-type impurities are implanted into the surface region of the semiconductor substrate 1 through the SiO$_2$ layer 25 which is located directly under the opening 26. A thin layer of the P-type semiconductive region 20 having a higher surface concentration (per square centimeters) of impurities than the semiconductor substrate 1 is formed in the semiconductor substrate 1.

Next, as shown in FIG. 8E, the SiO$_2$ layer 25 under the opening 26 is etched to expose the semiconductive region 20, by using the photo resist layer 24 as a mask. An opening 28 formed in the SiO$_2$ layer 25 by etching coincides exactly not only with the opening 26 of the photo resist layer 24, but also with the semiconductive region 20, both in length and width.

Figure 8F:
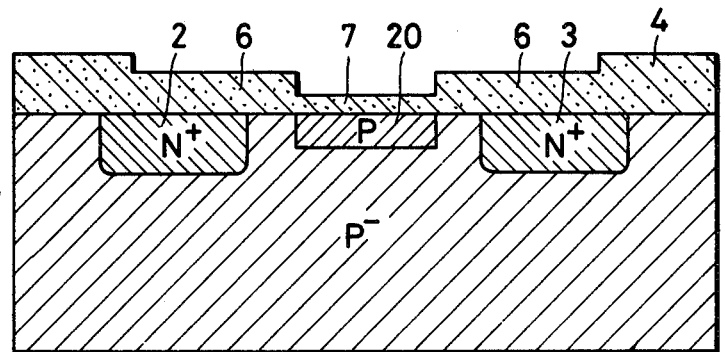
Figure 8G:
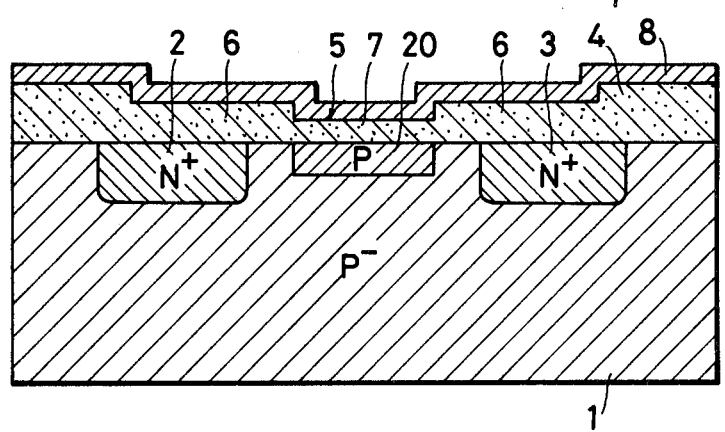

Next, as shown in FIG. 8F, the surface of the semiconductive region 20 exposed at the opening 28 is thermally oxidized to form the memory portion 7 of $SiO_2$. The thickness of the memory portion 7 is 20 to 30Å thick. At both sides of the memory portion 7, the $SiO_2$ layer 25 of thickness about 1000Å remains as the gate guarding portion 6. The semiconductive region 20 coincides nearly with the memory portion 7 in length and width. In other words, the memory portion 7 and the semiconductive region 20 are selfaligned with each other in such a manner that the photo resist layer 24 is used as a common mask for the ion implantation process and the etching process of FIG. 8D and FIG. 8E. Accordingly, the manufacturing process is very simple, and the yield rate is improved.

The photo resist layer 24 is removed, and then a $Si_3N_4$ layer 8 is epitaxially grown, to the thickness of 600 to 700Å, onto a gate insulating layer 5 consisting of the gate guarding portion 6 and the memory portion 7. Next, openings (not shown) are formed in the gate insulating layer 5 and the $Si_3N_4$ layer 8 for depositing a source electrode and a drain electrode. Aluminium is deposited on the $Si_3N_4$ layer 8. The aluminium layer is etched to form the electrode shown in FIG. 6.

Figure 9:
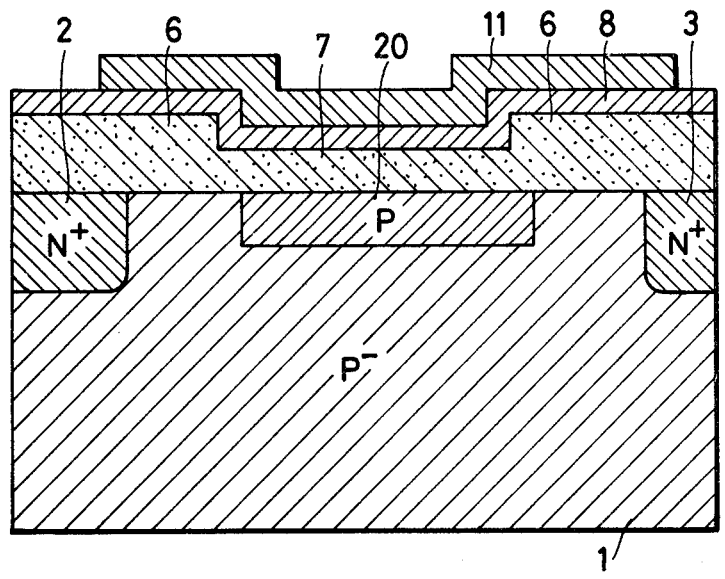
FIG. 9 is a cross-sectional view showing the situation that a surface portion having a higher surface impurity concentration in a semiconductor substrate is not aligned with a memory portion above the surface portion.

According to this embodiment, the memory portion 7 is exactly aligned with the semiconductive region 20. However, if photo resist is newly coated on the $SiO_2$ layer 21 at the step of FIG. 8E, a mask pattern is somewhat deflected from the semiconductive region 20 on etching, and as the result, the semiconductive region 20 is not aligned with the memory portion 7 as shown in FIG. 9. Since the thick gate guarding portion 6 overlaps partly the semiconductive region 20, there is the possibility that the $V_{TH}$ of the gate guarding portion 6 is somewhat increased, and so that the voltage difference between the $V_{TH}$ at the level "0" and the $V_{TH}$ at the level "1" is somewhat reduced.

Figure 10:
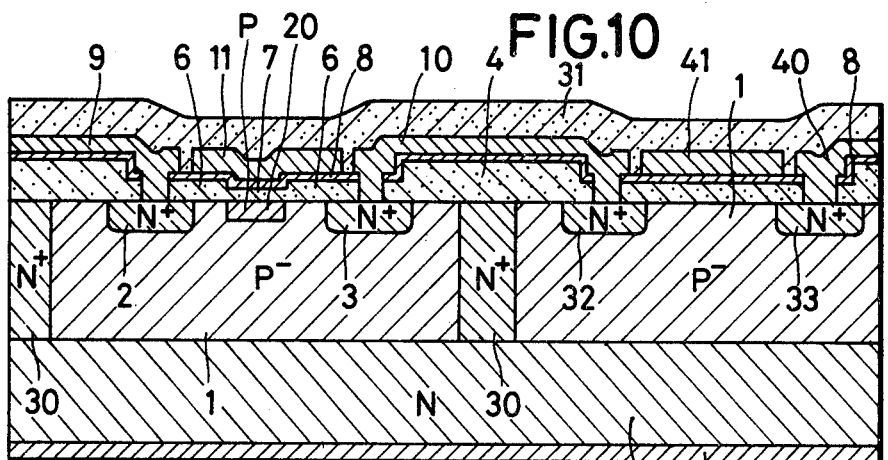
FIG. 10 is a cross-sectional view showing the situation that the memory transistor according to the one embodiment of this invention is assembled into an integrated circuit.

FIG. 10 shows an integrated circuit into which the memory transistor according to this embodiment is assembled.

Referring to FIG. 10, $N^+$-type isolation regions 30 are formed in the common semiconductor substrate 1 (actually an epitaial growth layer). The MNOS-type memory transistor according to this embodiment is formed between the $N^+$-type isolation regions 30. Another MNOS-type transistor for read-out is formed at the right side of the MNOS-type memory transistor. An $N^+$-type source region 32 and an $N^+$-type drain region 33 are formed in the MNOS-type transistor. The source region 32 of the MNOS-type transistor is connected through the drain electrode 10 to the drain region 3 of the MNOS-type memory transistor. Another drain electrode 40 and gate electrode 41 are separately formed in the MNOS-type transistor. A protecting $SiO_2$ layer 31 is deposited on the electrodes. An N-type semiconductive region 34 (actually a semiconductor substrate) is formed on the lower surface of the semiconductor substrate 1. A common electrode 35 of Au-Ni-Ag three-layers structure is deposited on the N-type semiconductive region 34.

Figure 11:
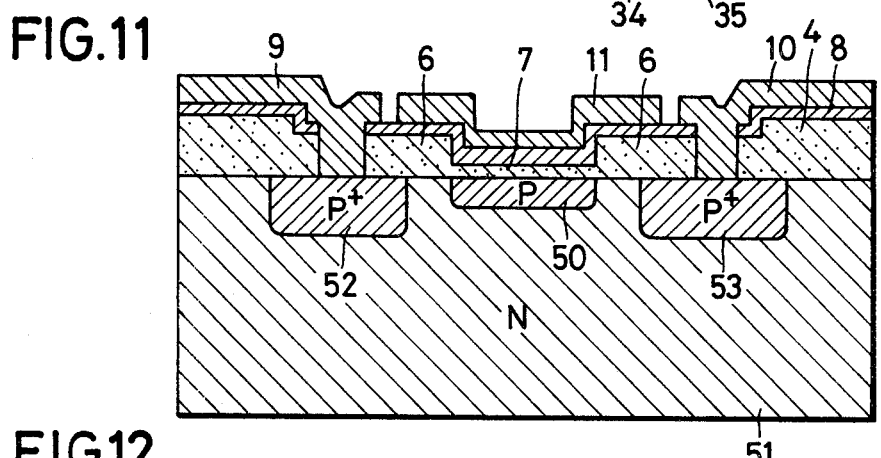
FIG. 11 is a cross-sectiona view of an integrated MNOS-type P-channel memory transistor according to another embodiment of this invention.

Next, another embodiment of this invention will be described with reference to FIG. 11 and FIG. 12.

This embodiment is different from the one embodiment in conductivity type. A $P^+$-type source region 52 and a $P^+$-type drain region 53 are formed in the surface of an N-type semiconductor substrate 51. Parts formed on the semiconductor substrate 51 are the same as the parts formed on the semiconductor substrate 1 of the one embodiment of this invention, and they are denoted by the same reference numerals, which will not be described here.

In this embodiment, a P-type semiconductive region 50 is formed in the semiconductor substrate 51 directly under the memory portion 7. The surface impurity concentration per square centimeter of the semiconductive region 50 is so selected as to be lower than the surface impurity concentration per square centimeter (about $10^{15}/cm^2$) of the semiconductor substrate 51. The surface impurity concentration of the P-type semiconductive region 50 is preferably $4 \times 10$ inches to $1 \times 10^{12}/cm^2$.

With such arrangement, the $V_{TH}$ of the memory portion 7 is lowered in negative polarity, and so it approaches closely to the $V_{TH}$ of the gate guarding portion 6. As shown in FIG. 12, the $V_{TH}$ of the memory portion 7 substantially coincides with the $V_{TH}$ of the gate guarding portion 6 at the level "0".

In the formation of the semiconductive region 50, an ion beam 23 of P-type impurities such as boron is injected into the semiconductor substrate 51 in the manufacturing stage corresponding to FIG. 8C at 50 KeV so as to obtain the surface impurity concentration of $2 \times 10$ inches/$cm^2$ so that the $V_{TH}$ between the source and drain regions 52 and 53 is previously lowered in negative polarity. Then, an ion beam 27 of P-type impurities such as boron is injected into the semiconductor substrate 51 in the manufacturing stage corresponding to FIG. 8D at 50 KeV so as to obtain the surface impurity concentration of $6 \times 10$ inches/$cm^2$ so that the surface impurity concentration of the semiconductor substrate 51 directly under the memory portion is compensated to convert the conductivity type of the surface region of the semiconductor substrate 51 directly under the memory portion. Thus, the P-type semiconductive region 50 is formed in the semiconductor substrate 51. The $V_{TH}$ of the memory portion 7 is lowered in negative polarity, and so it approaches closely to the $V_{TH}$ of the gate guarding portion 6.

Since the semiconductive region 50 functions to hold the positive charge in the memory portion 7, the $V_{TH}$ of the memory portion 7 is lowered in negative polarity. The semiconductive region 50 is self-aligned with the memory portion 7 in the manufacturing stages. It is undesirable that the semiconductive region 50 is shifted from the memory portion 7, since the $V_{TH}$ of the memory portion 7 is increased in negative polarity.

Figure 5:
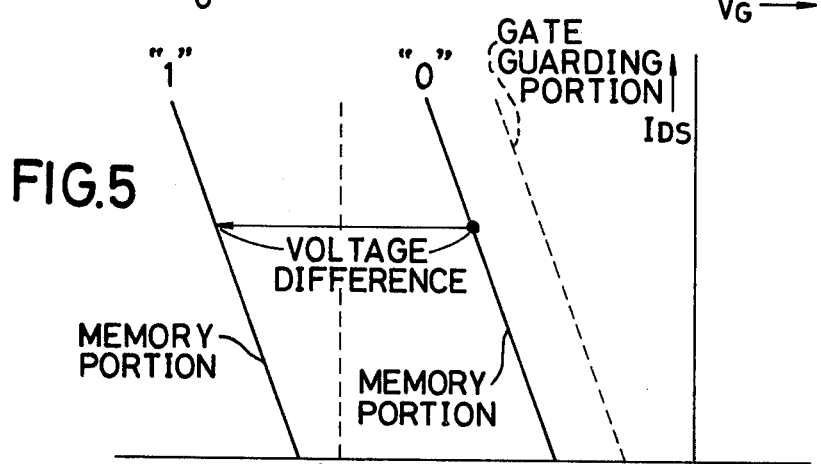
FIG. 5 is a graph showing the $I_{DS}$-$V_G$ characteristics of the MNOS-type P-channel memory transistor, the shift of the $V_{TH}$ of the memory transistor, and a read-out voltage of the memory transistor when the memory transistor is put at the level "1"
Figure 12:
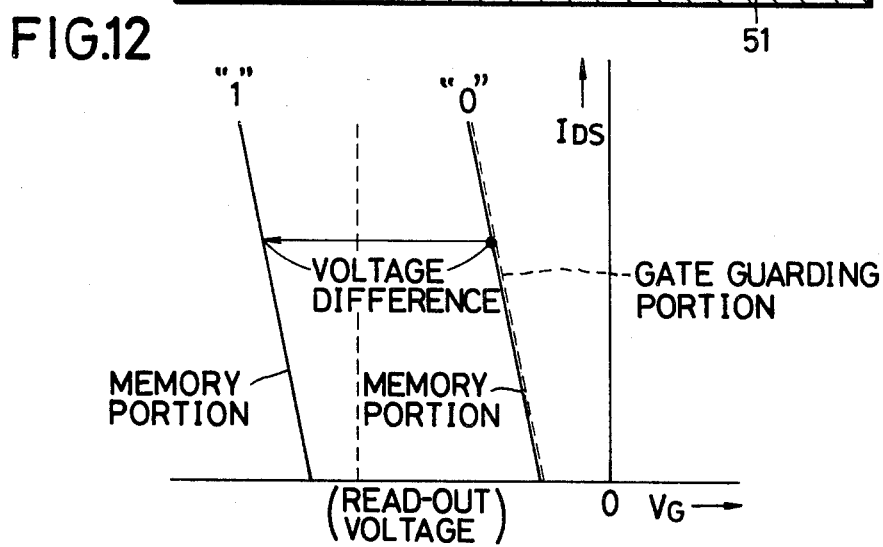
FIG. 12 is a graph showing the $I_{DS}$-$V_G$ characteristics of the memory transistor of FIG. 11, and the shift of the $V_{TH}$ of the memory transistor of FIG. 11, when the memory transistor is put at the level "1".

As shown in FIG. 12, the $V_{TH}$ of the memory portion 7 at the level "0" is lowered in negative polarity (see FIG. 5) and so the read-out voltage is lowered. Even when the voltage difference between the $V_{TH}$ at the level "0" and the $V_{TH}$ at the level "1" is relatively small, the $V_{TH}$ at the level "1" can be distant from the read-out voltage. Accordingly, even when the read-out voltage is lower, the read-out voltage can be satisfactorily distant both from the $V_{TH}$ at the level "1" and the $V_{TH}$ at the level "0". The power loss is reduced, and moreover the reliability of the integrated circuit can be improved.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined in the appended claims.

For example, the surface impurity concentration of the semiconductive regions 20 and 50 may be varied. In FIG. 7, the $V_{TH}$ of the memory portion may be higher beyond the $V_{TH}$ of the gate guarding portion. And instead of the $Si_3N_4$ layer, any other insulating layer such as $Al_2O_3$ layer may be formed on the $SiO_2$ layer.

According to this invention, as above described, since the surface impurity concentration per square centimeter of the semiconductor substrate directly under the memory portion is different from the surface impurity concentration per square centimeter of the semiconductor substrate directly under the gate guarding portion, the $V_{TH}$ of the memory portion approaches to the $V_{TH}$ of the gate guarding portion. Accordingly, the voltage difference between the $V_{TH}$ at the level "0" and the $V_{TH}$ at the level "1" can be increased. The circuit design is simple. A reliable memory transistor can be obtained. Moreover, since the semiconductive region having the different surface impurity concentration, and the memory portion can be formed by using the same masking layer, the manufacturing process is fasilitated and the characteristic of the memory transistor can be improved.

What is claimed is:

1. In a memory type insulated gate field effect semiconductor device including
   a semiconductor layer of one conductivity type having one surface,
   a source region of the opposite conductivity type formed adjacent to said one surface of said semiconductor layer,
   a drain region of the opposite conductivity type formed adjacent to said one surface of said semiconductor layer,
   a gate insulating layer affixed to the surface of said semiconductor layer, comprising a first insulating layer having a pair of thick gate guarding portions adjacent said source and drain regions, and a thin memory portion intermediate between said thick gate guarding portions and second insulating layer covering, said thin memory portion being between said thick gate portions, and
   a gate electrode deposited on the surface of said gate insulating layer,
   the improvement comprising means for shifting a threshold voltage of said thin memory portion substantially closer to a threshold voltage of said thick guarding portions, said means including a doped region of P type conductivity adjacent to said one surface under said thin memory portion and having a different surface impurity concentration than a surface impurity concentration of said semiconductor layer under said thick guarding portions.

2. A memory type insulated gate field effect semiconductor device according to claim 1, in which said surface impurity concentration of said doped region under said thin memory portion which is $4 \times 10^{11}$ to $1 \times 10^{12}/cm^2$, is lower than said surface impurity concentration of said semiconductor layer under said thick gate guarding portions, and the conductivity type of the surface region of said semiconductor layer under said thin memory portion is converted to the opposite conductivity type.

3. A memory type insulated gate field effect semiconductor device according to claim 1, in which said surface impurity concentration of said doped region under said thin memory portion which is $5 \times 10^{11}$ to $2 \times 10^{12}/cm^2$, is higher than said surface impurity concentration of said semiconductor layer under said thick gate guarding portions, and the doped region and semiconductor layer are of the same conductivity type.

4. A memory type insulating gate field effect semiconductor device according to claim 1, in which the thickness of said first insulating layer of said thin memory portion is 20 to 30 Å.

5. A memory type insulating gate field effect semiconductor device according to claim 1, in which the thickness of said first insulating layer of said thick gate guarding portions is 500 to 1000 Å.

6. A memory type insulating gate field effect semiconductor device according to claim 1, in which said first insulating layer is silicon dioxide.

7. A memory type insulating gate field effect semiconductor device according to claim 1, in which said second insulating layer is silicon nitride.

8. A memory type insulating gate field effect semiconductor device according to claim 1, in which both edges of said doped region are aligned with both edges of said thin memory portion.

9. A memory type insulating gate field effect semiconductor device according to claim 1 wherein said means for shifting shifts the threshold voltage of the thin memory portion so that it is substantially the same as the threshold voltage of the thick gate guarding portions.

* * * * *